(12) United States Patent
Stave

(10) Patent No.: US 11,217,284 B2
(45) Date of Patent: Jan. 4, 2022

(54) MEMORY WITH PER PIN INPUT/OUTPUT TERMINATION AND DRIVER IMPEDANCE CALIBRATION

(71) Applicant: Micron Technology, Inc., Boise, ID (US)

(72) Inventor: Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/839,893

(22) Filed: Apr. 3, 2020

(65) Prior Publication Data

US 2021/0312958 A1 Oct. 7, 2021

(51) Int. Cl.
*G11C 7/10* (2006.01)
*H03K 19/00* (2006.01)
*G11C 29/02* (2006.01)
*G11C 29/50* (2006.01)
*H03K 19/0175* (2006.01)

(52) U.S. Cl.
CPC .......... *G11C 7/1069* (2013.01); *G11C 7/1078* (2013.01); *G11C 29/022* (2013.01); *G11C 29/50008* (2013.01); *H03K 19/0005* (2013.01); *H03K 19/017545* (2013.01); *G11C 2207/105* (2013.01); *G11C 2207/2254* (2013.01)

(58) Field of Classification Search
CPC ............ G11C 7/1069; G11C 29/50008; G11C 7/1078; G11C 29/022; G11C 2207/2254; G11C 2207/105; H03K 19/017545; H03K 19/0005

USPC .......................................................... 326/30
See application file for complete search history.

(56) References Cited

U.S. PATENT DOCUMENTS

| | | | | |
|---|---|---|---|---|
| 2002/0018389 | A1* | 2/2002 | Ito ......................... | G06F 11/106 365/222 |
| 2005/0151561 | A1* | 7/2005 | Choi ................. | H03K 19/00384 326/27 |
| 2006/0262586 | A1* | 11/2006 | Solomon ............. | G06F 12/0207 365/63 |
| 2007/0030024 | A1* | 2/2007 | Lee ...................... | G11C 7/1051 326/30 |
| 2013/0250703 | A1* | 9/2013 | Matsuoka ........... | G11C 11/4093 365/189.11 |
| 2014/0002131 | A1* | 1/2014 | Shaeffer ......... | H03K 19/017545 326/30 |

(Continued)

*Primary Examiner* — Don P Le
(74) *Attorney, Agent, or Firm* — Perkins Coie LLP

(57) ABSTRACT

Memory devices and systems with per pin input/output termination and driver impedance calibration capabilities, and associated methods, are disclosed herein. In one embodiment, a device apparatus includes circuitry dedicated to an individual DQ pin of the device apparatus. The circuitry can be configured to (i) generate, at least in part, a voltage at the DQ pin based, at least in part, on an impedance internal to a host device electrically connected to the device apparatus and (ii) compare the voltage to a target voltage. Based, at least in part, on the comparison, the circuitry can be configured to adjust a resistance of an output driver and/or a termination circuit of the device apparatus that correspond to the DQ pin to adjust the impedance of the output driver and/or termination circuit to match an impedance associated with a corresponding input/output pin of the host device.

20 Claims, 4 Drawing Sheets

(56) References Cited

U.S. PATENT DOCUMENTS

| | | | |
|---|---|---|---|
| 2014/0269116 A1* | 9/2014 | Matsuoka | G11C 7/1057 |
| | | | 365/191 |
| 2015/0089164 A1* | 3/2015 | Ware | G11C 5/02 |
| | | | 711/149 |
| 2015/0255143 A1* | 9/2015 | Kuroki | G11C 29/028 |
| | | | 365/189.11 |
| 2015/0348603 A1* | 12/2015 | Lee | G11C 29/028 |
| | | | 365/189.07 |
| 2019/0043557 A1* | 2/2019 | Cox | G11C 11/4093 |
| 2019/0052268 A1* | 2/2019 | Lee | G11C 7/1057 |
| 2019/0066764 A1* | 2/2019 | Spirkl | G06F 13/16 |
| 2019/0259429 A1* | 8/2019 | Heo | G11C 11/4074 |
| 2019/0295609 A1 | 9/2019 | Arai et al. | |
| 2020/0321038 A1* | 10/2020 | Kojima | G11C 7/222 |
| 2021/0065807 A1* | 3/2021 | Tang | G11C 29/50008 |

* cited by examiner

MEMORY WITH PER PIN INPUT/OUTPUT TERMINATION AND DRIVER IMPEDANCE CALIBRATION

TECHNICAL FIELD

The present disclosure is related to memory systems, devices, and associated methods. In particular, the present disclosure is related to memory devices with per pin input/output termination and driver impedance calibration capabilities.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1:
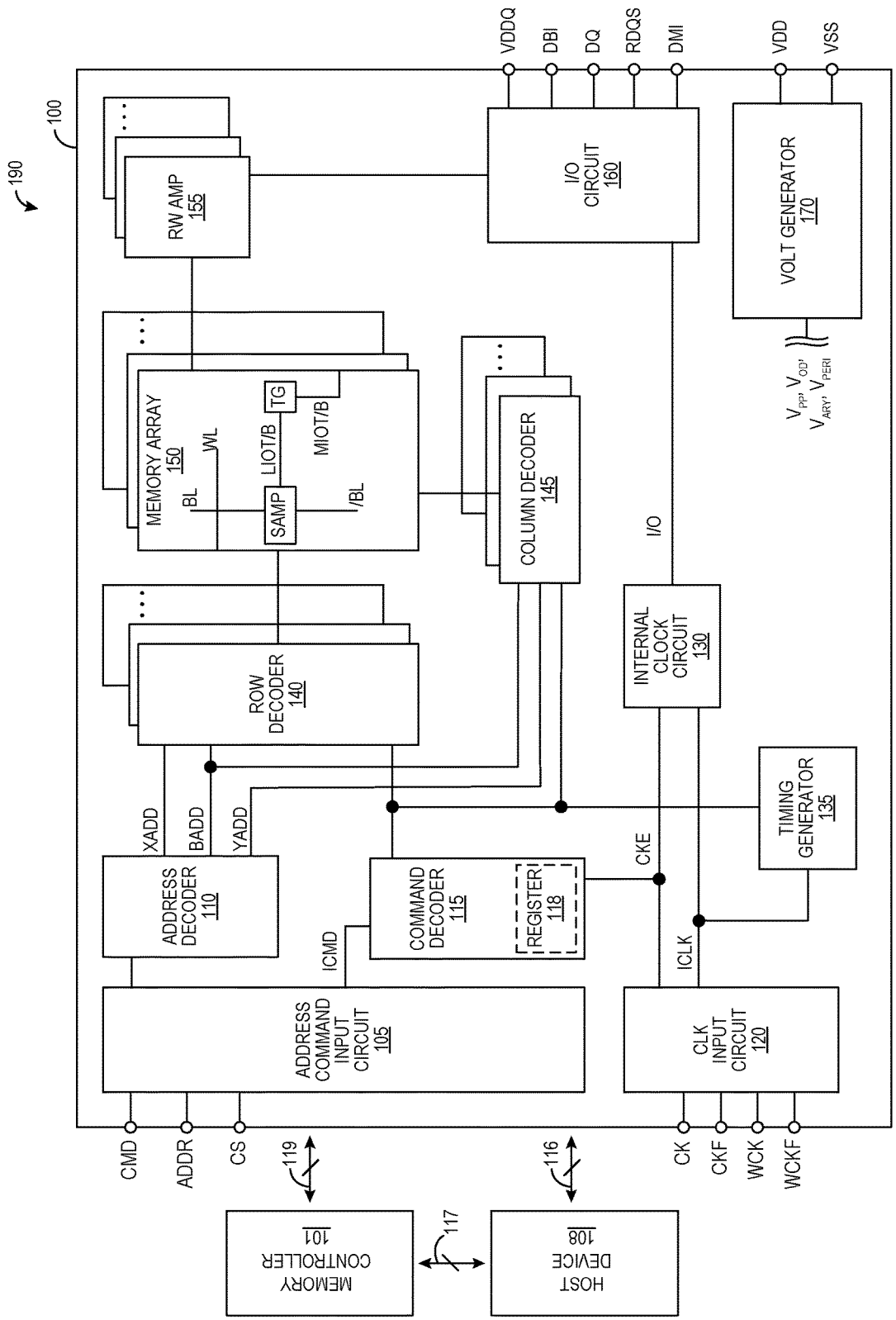
FIG. 1 is a block diagram schematically illustrating a memory system configured in accordance with various embodiments of the present technology.

As discussed in greater detail below, the technology disclosed herein relates to memory systems and devices with input/output (I/O) termination and driver calibration capabilities, and associated methods. In some embodiments, a memory device disclosed herein is configured to calibrate a DQ pin of the memory device to a respective I/O pin of a host device. For example, the memory device can include DQ calibration circuitry configured to adjust (i) the impedance of an output driver of the memory device corresponding to the DQ pin to match (ii) the impedance of a termination circuit of the respective I/O pin of the host device and the impedance of a data line connecting the memory device to the host device. Additionally, or alternatively, the DQ calibration circuitry can be configured to adjust (i) the impedance of a termination circuit of the memory device corresponding to the DQ pin to match (ii) the impedance of an output driver of the respective I/O pin of the host device and the impedance of the data line connecting the memory device to the host device.

In some embodiments, the DQ calibration circuitry on the memory device is dedicated to the individual DQ pin. As a result, the DQ calibration circuitry is able to calibrate the output driver impedance and/or termination circuit impedance of the DQ pin to the impedances of a corresponding output driver and a corresponding termination circuit, respectively, on the host device while also taking into consideration the impedance of the corresponding data line connecting the memory device to the host device. Thus, in contrast with the conventional ZQ calibration procedure discussed below with respect to FIG. 2, the DQ calibration procedure of the present technology takes into account both (i) process variations that may exist across DQ pins of different memory devices and (ii) process variations that may exist across DQ pins of the same memory device. Furthermore, as temperature and voltage (and therefore impedances) change during normal operation of the memory device, the DQ calibration circuitry in some embodiments can be used to periodically calibrate the output driver impedance and/or the termination circuit impedance of the DQ pin to the impedances of the corresponding output driver and/or the corresponding termination circuit, respectively, on the host device to account for changes in impedances. Therefore, in contrast with the conventional ZQ calibration procedure discussed below with respect to FIG. 2, the DQ calibration procedure of the present technology also takes into account non-uniform changes in temperature and voltage that occur across the DQ pins (and corresponding circuitry) of the memory device during normal operation of the memory device.

As such, in comparison with conventional ZQ calibration techniques, the DQ calibration circuitry of memory devices configured in accordance with various embodiments of the present technology can be used to better match impedances across multiple DQ pins of the memory devices with respective impedances of host devices and data lines connected to the memory device. Thus, the DQ calibration circuitry can further reduce, minimize, and/or prevent reflections and/or ringing of data signals transmitted over the corresponding data lines. In turn, the data output drivers of the memory device and/or of the host device are less likely to overshoot and/or undershoot desired signaling voltage levels, meaning that a memory device configured in accordance with the present technology is better able to maintain and/or improve signal timing and/or voltage margins in comparison with conventional ZQ calibration techniques. In turn, the memory device is able to maintain and/or improve the size of a corresponding data eye and thereby better maintain and/or improve performance of the memory device in comparison with conventional ZQ calibration techniques.

A person skilled in the art will understand that the technology may have additional embodiments and that the technology may be practiced without several of the details of the embodiments described below with reference to FIGS. 1-5. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

FIG. 1 is a block diagram schematically illustrating a memory system 190 configured in accordance with an embodiment of the present technology. The memory system 190 can include a memory device 100 that can be connected to any one of a number of electronic devices that is capable of utilizing memory for the temporary or persistent storage of information, or a component thereof. For example, the memory device 100 can be operably connected to a host device 108 and/or to a memory controller 101. The host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio and/or video, a vehicle, an appliance, a toy, or any one of a number of other products. In one embodiment, the host device 108 may be connected directly to the memory device 100 (e.g., via a communications bus 116 of signal traces), although in other embodiments, the host device 108 may be indirectly connected to the memory device 100 (e.g., over a networked connection or through intermediary devices, such as through the memory controller 101 and/or via one of more communication busses 117 and/or 119 of signal traces).

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, and power supply terminals VDD, VSS, and VDDQ.

The power supply terminals of the memory device 100 may be supplied with power supply potentials $V_{DD}$ and $V_{SS}$. These power supply potentials $V_{DD}$ and $V_{SS}$ can be supplied to an internal voltage generator circuit 170. The internal voltage generator circuit 170 can generate various internal potentials $V_{PP}$, $V_{OD}$, $V_{ARY}$, $V_{PERI}$, and the like based on the power supply potentials $V_{DD}$ and $V_{SS}$. The internal potential $V_{PP}$ can be used in a row decoder 140, the internal potentials $V_{OD}$ and $V_{ARY}$ can be used in sense amplifiers included in a memory array 150 of the memory device 100, and the internal potential $V_{PERI}$ can be used in many other circuit blocks.

The power supply terminals may also be supplied with power supply potential $V_{DDQ}$. The power supply potential $V_{DDQ}$ can be supplied to an input/output (I/O) circuit 160 together with the power supply potential $V_{SS}$. The power supply potential $V_{DDQ}$ can be the same potential as the power supply potential $V_{DD}$ in an embodiment of the present technology. The power supply potential $V_{DDQ}$ can be a different potential from the power supply potential $V_{DD}$ in another embodiment of the present technology. However, the dedicated power supply potential $V_{DDQ}$ can be used for the I/O circuit 160 so that power supply noise generated by the I/O circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from a command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command decoder 115. For example, the internal clock circuit 130 can include a clock path (not shown in FIG. 1) that receives the internal clock signal ICLK and provides various clock signals (not shown) to the command decoder 115. The internal clock circuit 130 can further provide input/output (I/O) clock signals. The I/O clock signals can be supplied to the I/O circuit 160 and can be used as timing signals to, for example, determine an output timing of read data and/or an input timing of write data. The I/O clock signals can be provided at multiple clock frequencies so that data can be output from and input into the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated that can be used by the command decoder 115, the column decoder 145, the I/O circuit 160, and/or other components of the memory device 100.

The memory device 100 may include an array of memory cells, such as memory array 150. The memory cells of the memory array 150 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be one or more memory banks or another arrangement of memory cells (e.g., half memory banks, subarrays in a memory bank, etc.). In these and other embodiments, the memory regions of the memory array 150 can be arranged in one or more groups (e.g., one or more groups of memory banks, one or more logical memory ranks or dies, etc.). Memory cells in the memory array 150 can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The command terminals and address terminals may be supplied with an address signal and a bank address signal from outside the memory device 100. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals can be supplied with command signals CMD, address signals ADDR, and chip selection signals CS (e.g., from the memory controller 101 and/or the host device 108). The command signals may represent various memory commands (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown) to the command decoder 115. The command decoder 115 may further include one or more registers 118 for tracking various counts or values.

When a read command is issued, and a row address and a column address are timely supplied with the read command, read data can be read from memory cells in the memory array 150 designated by these row address and column address. The read command may be received by the command decoder 115, which can provide internal commands to the I/O circuit 160 so that read data can be output from the data terminals DQ, RDQS, DBI, and DMI via read/write (RW) amplifiers 155 and the I/O circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued, and a row address and a column address are timely supplied with the command, write data can be supplied to the data terminals DQ, DBI, and DMI according to the WCK and WCKF clock signals. The write command may be received by the command decoder 115, which can provide internal commands to the I/O circuit 160 so that the write data can be received by data receivers in the I/O circuit 160, and supplied via the I/O circuit 160 and the RW amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

At higher data rates, data signals reflect (e.g., bounce back) and/or ring when the signals reach the end of a transmission path. Additionally, or alternatively, data signals reflect (e.g., bounce back) and/or ring when the signals encounter a change (e.g., a mismatch, a discontinuity, etc.) in impedance over the transmission path. Variations in process, voltage, temperature, and other factors (e.g., during normal operation of the memory device 100) can cause such impedance mismatches. As a data signal is reflected or rings, the signal can become distorted, impairing the quality of the signal and the data transmitted within it. For example, output drivers of the memory device 100 are configured to send data by driving data signals between high and low voltage levels. The differences between the high and low voltage levels defines a voltage margin for a corresponding receiver to interpret data sent within the signal. Temporal spacing between transitions of the signal between the high and low voltage levels provides a timing margin for the corresponding receiver to interpret the data sent within the signal. The timing margin and the voltage margins together define a size of a data eye, which reveals characteristics of the quality of the signaling environment.

Signal reflection or ringing can cause data output drivers to overshoot and/or undershoot desired signaling voltage levels, which can reduce the timing and/or voltage margins. Reduced timing margins limit a maximum signaling speed because the window of time over which the data is valid (e.g., the width of the data eye) is smaller. Reduced voltage margins (e.g., the height of the data eye) can require larger I/O voltage swings to ensure accurate transmission of data, which can result in an increase in the amount of I/O power consumed and/or in an increase in sensitivity of the data lines to cross talk.

To address these concerns, the memory device 100 can include on-die termination circuits (not shown in FIG. 1) at ends of data lines connecting the memory device 100 to the memory controller 101 and/or to the host device 108 to suppress signal reflections at the ends of the data lines. In these and other embodiments, as discussed in greater detail below with respect to FIGS. 2-4, the memory device 100 can include ZQ and/or DQ calibration circuitry (not shown in FIG. 1) to match (e.g., calibrate) (i) the impedance of the termination circuits (not shown) and/or output drivers (not shown) of the memory device 100 with (ii) the impedance of (a) corresponding output drivers (not shown) and corresponding termination circuits (not shown), respectively, of the memory controller 101 and/or the host device 108 and/or (b) corresponding data lines (e.g., data lines 119 and/or 116) connecting the memory controller 101 and/or the host device 108 to the memory device 100. In some embodiments, the memory device 100 can use the ZQ and/or DQ calibration circuits to calibrate the impedances at initial power-up of the memory device 100 or memory system 190 and/or when the memory device 100 and/or memory system 190 are placed in a reset condition. In these and other embodiments, the memory device 100 can track voltage and/or temperature changes associated with normal operation of the memory device 100 and can use the ZQ and/or DQ calibration circuits to calibrate (e.g., maintain linear) DQ output driver and termination circuit impedances over the tracked voltage and temperature ranges.

Figure 2:
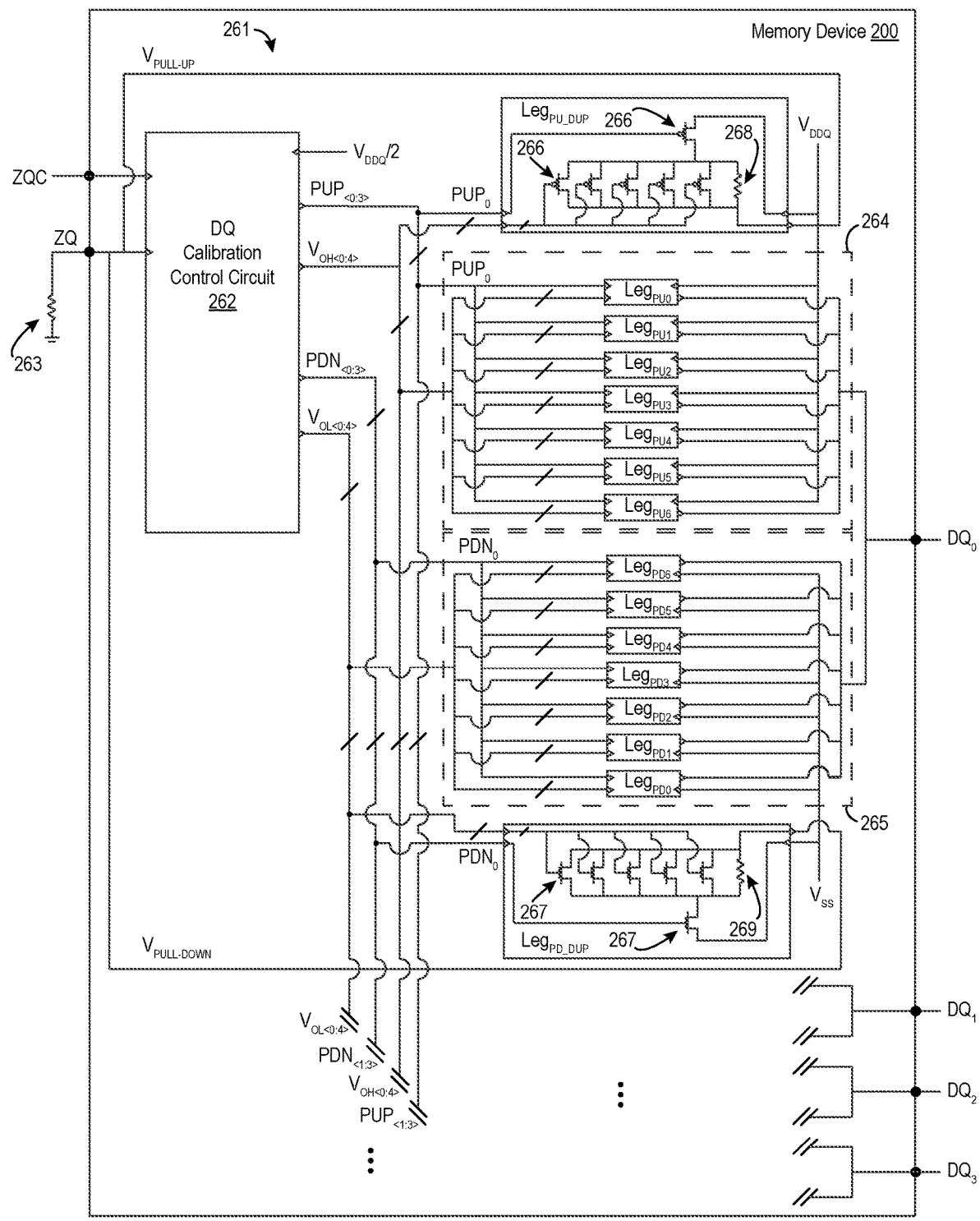
FIG. 2 is a block diagram schematically illustrating a memory device with conventional ZQ calibration circuitry.

FIG. 2 is a block diagram schematically illustrating a memory device 200 (e.g., the memory device 100 of FIG. 1 or another memory device) with conventional ZQ calibration circuitry 261. As shown, the ZQ calibration circuitry 261 includes a DQ calibration control circuit 262 ("control circuit 262") that is used to calibrate four DQ pins $DQ_{0-3}$ of the memory device 200. In some embodiments, the control circuit 262 includes an analog-to-digital converter (not shown), comparators (not shown), a majority filter (not shown), an internal reference voltage generator (not shown), and/or an approximation register (not shown).

The control circuit 262 is electrically connected to an external reference resistor 263 via a ZQ pin of the memory device 200. The external reference resistor 263 has a constant resistance (e.g., 240Ω±1%) across a range of temperatures and voltages associated with normal operation of the memory device 200. In the illustrated embodiment, the reference resistor 263 is connected to ground. In other embodiments, the reference resistor 263 can be connected to another potential.

The control circuit 262 is additionally connected to each of the DQ pins $DQ_{0-3}$ via a plurality of respective pull-up legs $LEG_{PU0-PU6}$ and a plurality of respective pull-down legs $LEG_{PD0-PD6}$. For the sake of clarity and understanding, only the pull-up legs $LEG_{PU0-PU6}$ and the pull-down legs $LEG_{PD0-PD6}$ of the DQ pin $DQ_0$ are shown in FIG. 2. Although the memory device 200 is illustrated with seven pull-up legs and seven pull-down legs for each DQ pin, the memory device 200 in other embodiments can include a lesser (e.g., zero to six) or greater (e.g., more than seven) number of pull-up legs and/or a lesser (e.g., zero to six) or greater (e.g., more than seven) number of pull-down legs per DQ pin.

The control circuit 262 is further connected to a duplicate pull-up leg $LEG_{PU\_DUP}$ and to a duplicate pull-down leg $LEG_{PU0-PU6}$ that are used to calibrate each of the DQ pins $DQ_{0-3}$ but are not part of any of the DQ pins $DQ_{0-3}$. As shown, the duplicate pull-up leg $LEG_{PU\_DUP}$ includes a plurality of P-channel devices 266 and a polyresistor 268. In some embodiments, the polyresistor 268 has a resistance slightly larger than the resistance of the external reference resistor 263 (e.g., slightly larger than 240Ω). As discussed in greater detail below, the P-channel devices 266 and the positive power supply voltage $V_{DD}$ and/or $V_{DDQ}$ are used to tune the polyresistor 268 to the resistance of the external reference resistor 263. The pull-up legs $LEG_{PU0-PU6}$ of each of the DQ pins $DQ_{0-3}$ have circuitry identical or at least similar to the duplicate pull-up leg $LEG_{PU\_DUP}$. Thus, the circuitry of the pull-up legs $LEG_{PU0-PU6}$ are not shown in FIG. 2 for the sake of clarity.

The duplicate pull-down leg $LEG_{PD\_DUP}$ and the pull-down legs $LEG_{PD0-PD6}$ of each of the DQ pins $DQ_{0-3}$ include circuitry similar to the duplicate pull-up leg $LEG_{PU\_DUP}$ and the pull-up legs $LEG_{PU0-PU6}$, respectively, except that the duplicate pull-down leg $LEG_{PD\_DUP}$ and the pull-down legs $LEG_{PD0-PD6}$ of each of the DQ pins $DQ_{0-3}$ use a plurality of N-channel devices 267 and the negative power supply voltage $V_{SS}$ to tune a polyresistor 269 to the resistance of the external reference resistor 263. In some embodiments, the polyresistor 269 is similar to the polyresistor 268. In other embodiments, however, the polyresistor 269 can differ from the polyresistor 268. For the sake of clarity, only the circuitry of the duplicate pull-down leg $LEG_{PD\_DUP}$ is shown in FIG. 2.

When a ZQ calibration command ZQC is provided to the control circuit 262, the memory device 200 calibrates the legs of each DQ pin to the external reference resistor 263. In particular, the control circuit 262 drives the pull-up line $PUP_0$ low, which pulls the duplicate pull-up leg $LEG_{PU\_DUP}$ to the positive power supply potential $V_{DDQ}$. In turn, the duplicate pull-up leg $LEG_{PU\_DUP}$ outputs a pull-up voltage $V_{PULL-UP}$ that is based at least in part on the resistance of the polyresistor 268 and the resistance of the external reference resistor 263. The pull-up voltage $V_{PULL-UP}$ is then fed into the control circuit 262, and the control circuit 262 compares the pull-up voltage $V_{PULL-UP}$ to a reference voltage $V_{DDQ/2}$. Based on the comparison, the control circuit 262 individually tunes the P-channel devices 266 of the duplicate pull-up leg $LEG_{PU\_DUP}$ using tuning signals $V_{OH<0:4>}$ until the polyresistor 268 has a resistance that brings the pull-up voltage $V_{PULL-UP}$ equal to the reference voltage $V_{DDQ/2}$ (e.g., until the polyresistor 268 has a resistance equal to the resistance of the external reference resistor 263). The combination of the tuning signals $V_{OH<0:4>}$ that brings the pull-up voltage $V_{PULL-UP}$ equal to the reference voltage $V_{DDQ/2}$ is then stored in the approximation register (not shown) of the control circuit 262 and is broadcast to each of the pull-up legs $LEG_{PU0-PU6}$ of each of the DQ pins $DQ_{0-3}$.

After the pull-up legs $LEG_{PU0-PU6}$ of the DQ pins $DQ_{0-3}$ are calibrated to the external reference resistor 263 using the stored combination of tuning signals $V_{OH<0:4>}$, the memory device 200 uses a similar procedure to generate a combination of tuning signals $V_{OH<0:4>}$ that brings a pull-down voltage $V_{PULL-DOWN}$ output from the duplicate pull-down leg $LEG_{PD\_DUP}$ equal to the reference voltage $V_{DDQ/2}$. For example, the control circuit 262 drives the pull-down line $PDN_0$ such that the duplicate pull-down leg $LEG_{PD\_DUP}$ is pulled to the negative power supply potential $V_{SS}$. In turn, the duplicate pull-down leg $LEG_{PD\_DUP}$ outputs the pull-down voltage $V_{PULL-DOWN}$ based at least in part on the resistance of the polyresistor 269 and the resistance of the external reference resistor 263. The pull-down voltage $V_{PULL-DOWN}$ is then fed into the control circuit 262, and the control circuit 262 compares the pull-down voltage $V_{PULL-DOWN}$ to the reference voltage $V_{DDQ/2}$. Based on the comparison, the control circuit 262 individually tunes the N-channel devices 267 of the duplicate pull-down leg $LEG_{PD\_DUP}$ using tuning signals $V_{OL<0:4>}$ until the polyresistor 269 has a resistance that brings the pull-down voltage $V_{PULL-DOWN}$ equal to the reference voltage $V_{DDQ/2}$ (e.g., until the polyresistor 269 has a resistance equal to the resistance of the external reference resistor 263). The combination of the tuning signals $V_{OL<0:4>}$ that brings the pull-down voltage $V_{PULL-DOWN}$ equal to the reference voltage $V_{DDQ/2}$ is then stored in the approximation register (not shown) of the control circuit 262 and is broadcast to each of the pull-down legs LEG$_{PU0-PU6}$ of each of the DQ pins DQ$_{0-3}$, completing calibration of the DQ pins DQ$_{0-3}$.

By performing ZQ calibration using the ZQ calibration circuitry 261 at initial power-up of the memory device 200 and/or when the memory device 200 is in a reset condition, the memory device 200 is able to account for process variations that exist across memory devices 200. Additionally, by periodically performing ZQ calibration using the ZQ calibration circuitry 261 during normal operation of the memory device 200, the memory device 200 can account for changes in temperature and voltage that affect the impedance of the output driver and termination circuits.

As shown in FIG. 2, the pull-up legs LEGS$_{PU0-PU6}$ together define an output driver 265 of the DQ pin DQ$_0$. Similarly, the pull-down legs LEGS$_{PD0-PD6}$ together define a termination circuit of the DQ pin DQ$_0$. After performing ZQ calibration using the ZQ calibration circuitry 261, the memory device 200 can realize multiple termination impedances per DQ pin by enabling various combinations of the pull-down legs LEG$_{PD0-PD6}$ for each DQ pin. Similarly, the memory device 200 can realize various output driver impedances (e.g., drive strengths) by enabling various combinations of the pull-up legs LEG$_{PU0-PU6}$ for each DQ pin. For example, when the resistances of the external reference resistor 263 and the polyresistors 268 are approximately 240Ω, the output impedance of the output driver 265 for the DQ pin DQ$_0$ is approximately 34Ω when all seven of the pull-up legs LEG$_{PU0-PU6}$ of the DQ pin DQ$_0$ are enabled. In this manner, the memory device 200 is able to tune the output driver impedance (for read operations) and termination circuit impedance (for write operations) to the impedance of the data lines connecting the memory device 200 to a memory controller and/or a host device via a DQ pin of the memory device 200, thereby reducing impedance discontinuities or mismatches between (i) the output driver impedance and/or the termination circuit impedance and (ii) the traces connecting the memory device 200 to a memory controller and/or to a host device.

There are, however, several drawbacks of the conventional ZQ calibration procedure described above. For example, because a single duplicate pull-up leg LEG$_{PU-DUP}$ and a single duplicate pull-down leg LEG$_{PD\_DUP}$ are used to tune each of the pull-up legs and pull-down legs, respectively, of each DQ pin of the memory device 200, the conventional ZQ calibration procedure does not take into consideration process variations that may exist across the pull-up legs LEGS$_{PU0-PU6}$ and across the pull-down legs LEGS$_{PD0-PD6}$ of the memory device 200. In addition, the conventional ZQ calibration procedure assumes that temperature and voltage uniformly change across all of the pull-up legs LEGS$_{PU0-PU6}$ and across all of the pull-down legs LEGS$_{PD0-PD6}$ of all of the DQ pins DQ$_{0-3}$ the memory device 200 during normal operation of the memory device 200. Furthermore, the conventional ZQ calibration procedure discussed above does not account for the possibility that a first data line connecting a first DQ pin of the memory device 200 to a memory controller and/or to a host device can have a different impedance than a second data line connecting a second DQ pin of the memory device 200 to the memory controller and/or to the host device. Nor does the conventional ZQ calibration procedure consider that a driver or termination circuit of the memory controller and/or the host device corresponding to the first DQ pin of the memory device 200 can have a different impedance than a driver or termination circuit of the memory controller and/or the host device corresponding to the second DQ pin of the memory device 200.

Figure 3:
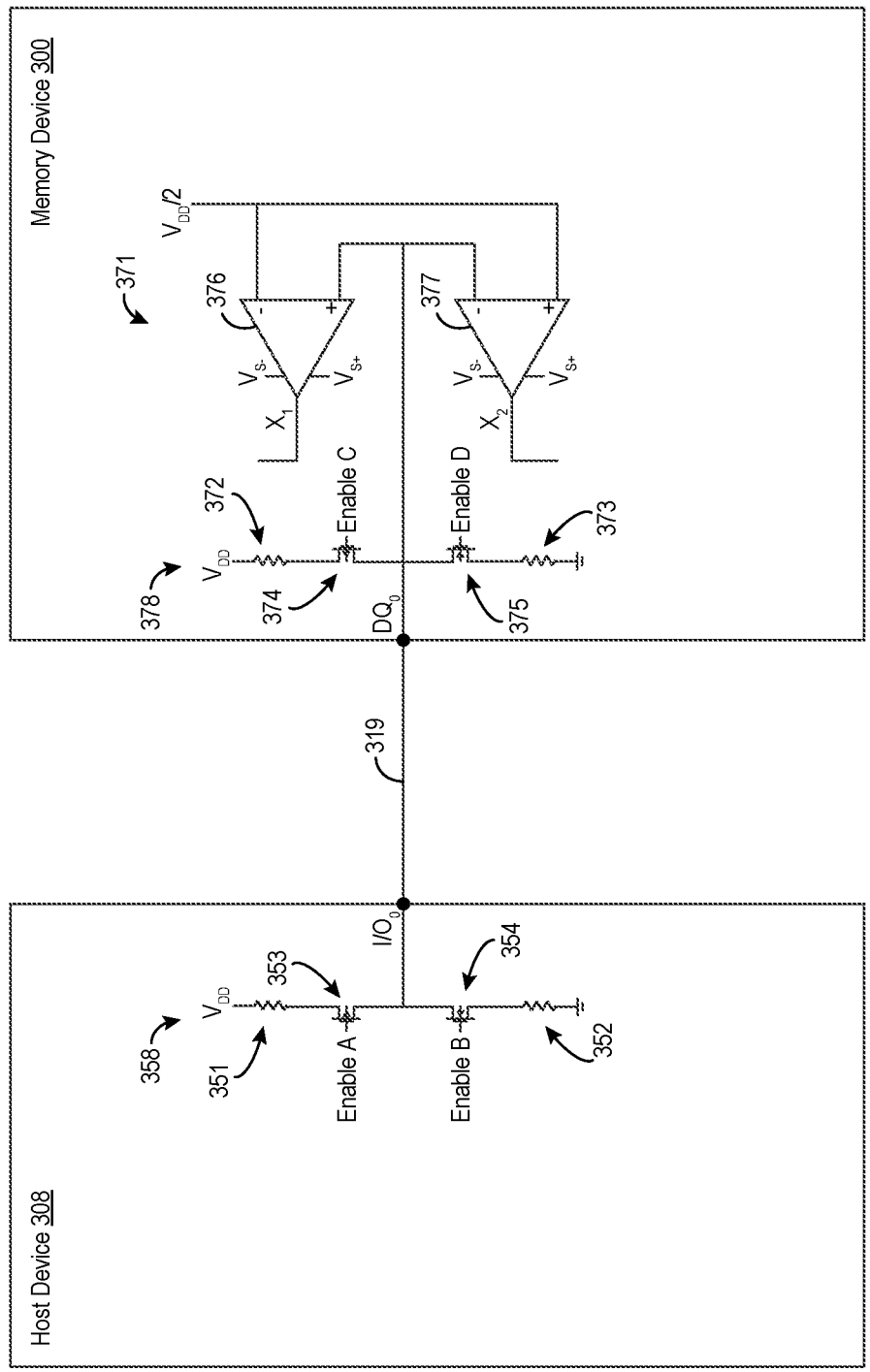
FIG. 3 is a block diagram of a memory device with DQ calibration circuitry configured in accordance with various embodiments of the present technology.

To address these concerns, memory devices configured in accordance with the present technology can include dedicated DQ calibration circuitry for individual DQ pins of the memory devices. For example, FIG. 3 is a block diagram of a memory device 300 configured in accordance with various embodiments of the present technology. In some embodiments, the memory device 300 can be the memory device 100 of FIG. 1 and/or the memory device 200 of FIG. 2. In other embodiments, the memory device 300 can be a different memory device than the memory device 100 and/or the memory device 200.

As shown in FIG. 3, the memory device 300 includes DQ calibration circuitry 371 electrically connected to a corresponding DQ pin DQ$_0$ of the memory device 300. For the sake of clarity and understanding, only one DQ pin and corresponding DQ calibration circuitry 371 of the memory device 300 is illustrated in FIG. 3. Persons of ordinary skill in the art will readily appreciate that the DQ calibration circuitry 371 can be duplicated for all or a subset of the other DQ pins of the memory device 300.

In the illustrated embodiment, the DQ calibration circuitry 371 includes a voltage divider 378 and two comparators 376 and 377. The voltage divider 378 connects a power supply potential $V_{DD}$ to ground via a variable resistor 372, a transistor 374 (e.g., a P-channel device), a transistor 375 (e.g., an N-channel device), and a variable resistor 373. In some embodiments, the variable resistor 372 can be similar to the variable resistor 373. In other embodiments, the variable resistor 372 can be different than the variable resistor 373.

In these and other embodiments, the DQ calibration circuitry 371 can include additional components in addition to or in lieu of the components illustrated in FIG. 3. For example, the DQ calibration circuitry 371 in some embodiments can include two transistors in lieu of the comparator 376 or the comparator 377. A leg of each of the two transistors can be connected to the output of the remaining comparator 376 or 377. In these embodiments, the memory device 300 can use the output of the remaining comparator 376 or 377 to calibrate either or both of the variable resistors 372 and/or 373 (as discussed in greater detail below) depending on the state of enable signals (not shown) fed to respective gates of the two transistors.

As described in greater detail below with respect to FIG. 4, the voltage divider 378 of the memory device 300 illustrated in FIG. 3 functions as both an output driver and a termination circuit of the DQ pin DQ$_0$. In this regard, the transistor 374 and the transistor 375 can be activated using enable signals ENABLE C and ENABLE D, respectively, depending on the function of the voltage divider 378 as an output driver or as a termination circuit, respectively, of the DQ pin DQ$_0$. Therefore, a person of ordinary skill in the art will readily appreciate that the voltage divider 378 of the memory device 300 illustrated in FIG. 3 can be a simplified circuit diagram of one or more other, more complex circuits. For example, the variable resistor 372 and the transistor 374 can be a simplified circuit diagram of a more complex output driver that has a resistance or impedance corresponding to the resistance of the variable resistor 372 and that is enabled using the enable signal ENABLE C. As another example, the variable resistor 373 and the transistor 375 can be a simplified circuit diagram of a more complex termination circuit that has a resistance or impedance corresponding to the resistance of the variable resistor 373 and that is enabled using the enable signal ENABLE D.

In some embodiments, the memory device 300 includes the DQ calibration circuitry 371 in lieu of conventional ZQ calibration circuitry (e.g., in lieu of the ZQ calibration circuitry 261 of FIG. 2). In these embodiments, the memory device 300 may not include a ZQ pin. In these and other embodiments, a memory controller, a PCB, or a host device connected to the memory device 300 may not include an external reference resistor (e.g., the external reference resistor 263 of FIG. 2). In other embodiments, the memory device 300 includes the DQ calibration circuitry 371 in addition to ZQ calibration circuitry.

As shown in FIG. 3, the DQ calibration circuitry 371 is electrically connected to a voltage divider 358 (e.g., to an output driver and/or a termination circuit) of a host device 308 via the DQ pin $DQ_0$, a corresponding data line 319, and a corresponding I/O pin $I/O_0$ of the host device 308. In some embodiments, the host device 308 can be a memory controller (e.g., the memory controller 101 of FIG. 1). In other embodiments, the host device 308 is another host device 308, such as the host device 108 of FIG. 1.

In the illustrated embodiment, the voltage divider 358 of the host device 308 is similar to the voltage divider 378 of the memory device 300. For example, the voltage divider 350 connects a power supply potential $V_{DD}$ to ground via a resistor 351, a transistor 353 (e.g., a P-channel device), a transistor 354 (e.g., an N-channel device), and a resistor 352. A person of ordinary skill in the art will readily appreciate that the voltage divider 358 of the host device 308 illustrated in FIG. 3 can be a simplified circuit diagram of one or more other, more complex circuits. For example, the resistor 351 and the transistor 353 can be a simplified circuit diagram of a more complex output driver that has a resistance or impedance corresponding to the resistance of the resistor 351 and that is enabled using an enable signal ENABLE A. As another example, the resistor 352 and the transistor 354 can be a simplified circuit diagram of a more complex termination circuit that has a resistance or impedance corresponding to the resistance of the resistor 352 and that is enabled using an enable signal ENABLE B.

As described in greater detail below with reference to FIG. 4, the voltage divider 358 of the host device 308 and the voltage divider 378 of the memory device 300 operate in tandem to generate a voltage $V_{DQ0}$ at the DQ pin $DQ_0$ (between the transistor 374 and the transistor 375 of the voltage divider 378) that is then fed as an input into the comparators 376 and 377 of the DQ calibration circuitry 371. The voltage $V_{DQ0}$ generated at the DQ pin $DQ_0$ is based, at least in part, on (i) the impedance of the output driver and/or termination circuit of the voltage divider 358 of the host device 308, (ii) the impedance of the termination circuit and/or the output driver, respectively, of the voltage divider 378 of the memory device 300, and (iii) the impedance of the data line 319 connecting the voltage divider 358 to the voltage divider 378. In turn, the comparators 376 and 377 compare the voltage $V_{DQ0}$ generated at the DQ pin $DQ_0$ to a target voltage. In the illustrated embodiment, the target voltage is an internally generated reference voltage $V_{DD/2}$. In other embodiments, the target voltage can be another internally generated or externally supplied potential. For example, the memory device 300 in some embodiments can include an external target voltage pin (not shown) through which any desired voltage can be input into the memory device 300 and fed, at least in part, into an input of the comparators 376 and/or 377 as a target voltage. In this manner, the externally supplied potential can be used to tune a voltage center of a data eye to any level for best performance of the memory device 300.

Referring again to the embodiment illustrated in FIG. 3, the comparators 376 and 377 output calibration potentials $X_1$ and $X_2$, respectively, based at least in part on the comparison of the voltage $V_{DQ0}$ to the target voltage (e.g., to the reference voltage $V_{DD/2}$). The memory device 300 uses the calibration potential $X_1$ to tune (e.g., adjust) the resistance of the variable resistor 372 until the voltage $V_{DQ0}$ is equal to the target voltage (e.g., is equal to the reference voltage $V_{DD/2}$), at which point the impedance (e.g., drive strength) of the output driver of the voltage divider 378 matches (e.g., aligns, is equal to, is substantially equal to, is continuous with, etc.) the impedance of the corresponding termination circuit of the voltage divider 358 on the host device 308 and the impedance of the data line 319 connecting the memory device 300 to the host device 308. Similarly, the memory device 300 uses the calibration potential $X_2$ to tune the resistance of the variable resistor 373 until the voltage $V_{DQ0}$ is equal to the target voltage (e.g., is equal to the reference voltage $V_{DD/2}$), at which point the impedance of the termination circuit of the voltage divider 378 matches the impedance of the corresponding output driver of the voltage divider 358 on the host device 308 and the impedance of the data line 319 connecting the memory device 300 to the host device 308.

Because the DQ calibration circuitry 371 is dedicated to (e.g., electrically connected only to and/or functions only for) a single DQ pin, the DQ calibration circuitry 371 is able to calibrate (e.g., match, align, etc.) the output driver impedance and termination circuit impedance of the DQ pin to the impedances of a corresponding output driver and a corresponding termination circuit, respectively, on the host device 308 and the impedance of the corresponding data line 319 connecting the memory device 300 to the host device 308. Thus, in contrast with the conventional ZQ calibration procedure discussed above with respect to FIG. 2, the DQ calibration procedure of FIG. 3 takes into account both (i) process variations that may exist across DQ pins of different memory devices 300 and (ii) process variations that may exist across DQ pins of the same memory device 300. Furthermore, as temperature and voltage change during normal operation of the memory device 300, the DQ calibration circuitry 371 of FIG. 3 can be used in some embodiments to calibrate (e.g., periodically) the output driver impedance and/or the termination circuit impedance of the DQ pin to the impedances of the corresponding output driver and/or the corresponding termination circuit, respectively, on the host device 308. Therefore, in contrast with the conventional ZQ calibration procedure discussed above with respect to FIG. 2, the DQ calibration procedure of FIG. 3 also takes into account non-uniform changes in temperature and voltage that occur across the DQ pins (and corresponding circuitry) of the memory device 300 during normal operation of the memory device 300.

As a result, in comparison with conventional ZQ calibration techniques, the DQ calibration circuitry 371 of the memory device 300 can be used to better match impedances across multiple DQ pins of the memory device 300 with respective impedances of the host device 308 and the data lines 319. As such, the DQ calibration circuitry 371 can further reduce, minimize, and/or prevent reflections and/or ringing of data signals transmitted over the corresponding data lines 319. In turn, the data output drivers of the memory device 300 and/or of the host device 308 are less likely to overshoot and/or undershoot desired signaling voltage levels, meaning that the memory device 300 is better able to maintain and/or improve timing and/or voltage margins in comparison with conventional ZQ calibration techniques. Therefore, the memory device 300 is able to maintain and/or improve the size of a corresponding data eye and thereby better maintain and/or improve performance of the memory device 300 in comparison with conventional ZQ calibration techniques.

Figure 4:
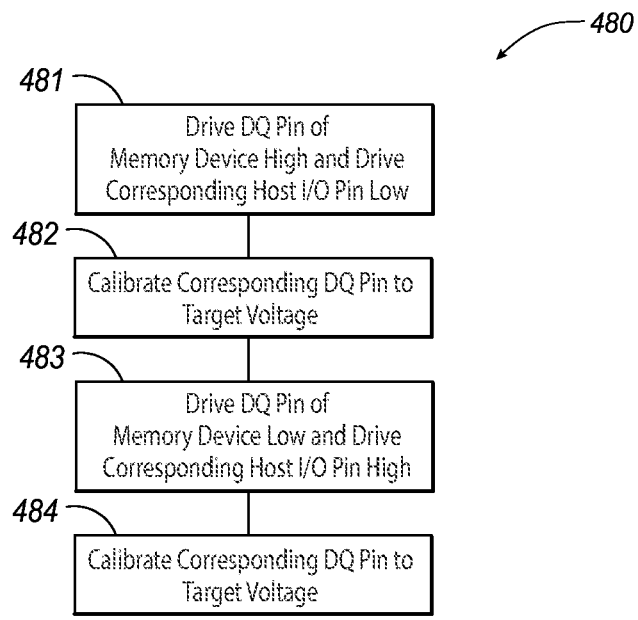
FIG. 4 is a flow diagram illustrating a routine for calibrating a DQ pin of a memory device and/or a memory system configured in accordance with various embodiments of the present technology.

FIG. 4 is a flow diagram illustrating a routine 480 for calibrating one or more DQ pins of a memory device and/or a memory system configured in accordance with various embodiments of the present technology. The routine 480 is illustrated as a set of steps or blocks 481-484 and is described at least in part below with reference to FIG. 3. All or a subset of one or more of the blocks 481-484 of the routine 480 can be executed by components or devices of (i) a memory device (e.g., the memory devices 100, 200, and/or 300 of FIGS. 1, 2, and/or 3, respectively), (ii) a memory controller (e.g., the memory controller 101 of FIG. 1) operably coupled to the memory device, and/or (iii) a host device (e.g., the host device 108 and/or 308 of FIGS. 1 and/or 3, respectively) operably coupled to the memory device and/or to the memory controller. For example, all or a subset of one or more of the blocks 481-484 of the routine 480 can be executed by DQ calibration circuitry (e.g., the DQ calibration circuitry 371 of FIG. 3) of the memory device and/or by one or more output drivers and/or termination circuits (e.g., the voltage divider 358 of FIG. 3) of the memory controller and/or host device. In these and other embodiments, all or a subset of one or more of the blocks 481-484 of the routine 480 can be performed by other components of the memory device (e.g., a command decoder, a voltage generator, an external target voltage pin, etc.), by components of the memory controller, by components of the host device, and/or by other components of a memory system (e.g., the memory system 190 of FIG. 1) containing the memory device.

The routine 480 begins at block 481 by driving a DQ pin of a memory device high while driving a corresponding I/O pin of a host device low. Referring to FIGS. 3 and 4 together, for example, the routine 480 can drive the DQ pin $DQ_0$ of the memory device 300 high by driving the enable signal ENABLE C such that the transistor 374 of the voltage divider 378 of the DQ calibration circuitry 371 is activated (e.g., such that the output driver of the DQ pin $DQ_0$ is activated). In these and other embodiments, the routine 480 can drive the corresponding I/O pin $I/O_0$ of the host device 308 low by driving the enable signal ENABLE B such that the transistor 354 of the voltage divider 358 is activated (e.g., such that the termination circuit of the I/O pin $I/O_0$ is activated).

At block 482, the routine 480 calibrates the DQ pin of the memory device while the DQ pin is driven high and while the corresponding I/O pin is driven low. In some embodiments, the routine 480 calibrates the DQ pin of the memory device by adjusting an impedance associated with the DQ pin (e.g., an impedance of an output driver internal to the memory device and corresponding to the DQ pin) to match (e.g., align, make equal to, make substantially equal to, make continuous with, etc.) an impedance associated with a corresponding I/O pin of the host device (e.g., with an impedance of a termination circuit internal to the host device and of the corresponding I/O pin and/or with an impedance of the data line electrically connecting the host device to the memory device via the DQ pin). Referring to FIGS. 3 and 4 together, for example, the routine 480 calibrates the DQ pin $DQ_0$ by adjusting the resistance of the variable resistor 372 of the voltage divider 378 (e.g., by adjusting the resistance of the output driver of the DQ pin $DQ_0$) until a potential or voltage $V_{DQ0}$ at the DQ pin $DQ_0$ is equivalent to a target voltage. In particular, the voltage divider 378 of the memory device 300 and the voltage divider 358 of the host device 308 of FIG. 3 generate the voltage $V_{DQ0}$ at the DQ pin $DQ_0$ when the routine 480 drives the DQ pin $DQ_0$ high and drives the corresponding I/O pin $I/O_0$ low. The voltage $V_{DQ0}$ is based at least in part on the power supply potential $V_{DD}$ in the memory device 300, the resistance of the variable resistor 372, the resistance of the resistor 352, and/or the resistance of the data line 319 connecting the voltage divider 378 of the memory device 300 to the voltage divider 358 of the host device 308. The routine 480 at block 482 compares the voltage $V_{DQ0}$ to a target voltage by feeding the voltage $V_{DQ0}$ and the target voltage into inputs of a comparator 376 of the DQ calibration circuitry 371. In the embodiment illustrated in FIG. 3, the target voltage is an internally generated reference potential $V_{DD/2}$. In other embodiments, the target voltage can be a different potential. For example, the target voltage can be supplied to or generated based at least in part on a potential supplied to an external pin (not shown) of the memory device 300. Based at least in part on the comparison, the routine 480 generates a calibration potential $X_1$, which the routine 480 uses to adjust the resistance of the variable resistor 372 until the voltage $V_{DQ0}$ at the DQ pin $DQ_0$ is equivalent to the target voltage. At this point, the impedance of the output driver of the DQ pin $DQ_0$ of the memory device 300 matches the impedance of the termination circuit of the corresponding I/O pin $I/O_0$ of the host device 308 and the impedance of the data line 319.

At block 483, the routine 480 drives a DQ pin of a memory device low while driving a corresponding I/O pin of a host device high. Referring to FIGS. 3 and 4 together, for example, the routine 480 can drive the DQ pin $DQ_0$ of the memory device 300 low by driving the enable signal ENABLE D such that the transistor 375 of the voltage divider 378 of the DQ calibration circuitry 371 is activated (e.g., such that the termination circuit of the DQ pin $DQ_0$ is activated). In these and other embodiments, the routine 480 can drive the I/O pin $I/O_0$ of the host device 308 high by driving the enable signal ENABLE A such that the transistor 353 of the voltage divider 358 is activated (e.g., such that the output driver of the I/O pin $I/O_0$ is activated).

At block 484, the routine 480 calibrates the DQ pin of the memory device while the DQ pin is driven low and while the corresponding I/O pin is driven high. In some embodiments, the routine 480 calibrates the DQ pin of the memory device by adjusting an impedance associated with the DQ pin (e.g., an impedance of a termination circuit internal to the memory device and corresponding to the DQ pin) to match (e.g., align, make equal to, make substantially equal to, make continuous with, etc.) an impedance associated with a corresponding I/O pin of the host device (e.g., with an impedance of an output driver internal to the host device and corresponding to the I/O pin and/or with an impedance of the data line electrically connecting the host device to the memory device via the DQ pin). Referring to FIGS. 3 and 4 together, for example, the routine 480 calibrates the DQ pin $DQ_0$ by adjusting the resistance of the variable resistor 373 of the voltage divider 378 (e.g., by adjusting the resistance of the termination circuit of the DQ pin $DQ_0$) until a potential or voltage $V_{DQ0}$ at the DQ pin $DQ_0$ is equivalent to a target voltage. In particular, the voltage divider 378 of the memory device 300 and the voltage divider 358 of the host device 308 of FIG. 3 generate the voltage $V_{DQ0}$ at the DQ pin DQ0 when the routine 480 drives the DQ pin $DQ_0$ low and drives the corresponding I/O pin $I/O_0$ high. The voltage $V_{DQ0}$ is based at least in part on the power supply potential $V_{DD}$ in the host device 308, the resistance of the variable resistor 373, the resistance of the resistor 351, and/or the resistance of the data line 319 connecting the voltage divider 378 of the memory device 300 to the voltage divider 358 of the host device 308. The routine 480 at block 484 compares the voltage $V_{DQ0}$ to a target voltage by feeding the voltage $V_{DQ0}$ and the target voltage into inputs of a comparator 377 of the DQ calibration circuitry 371. In the embodiment illustrated in FIG. 3, the target voltage is an internally generated reference potential $V_{DD/2}$. In other embodiments, the target voltage can be a different potential. For example, the target voltage can be supplied to or generated based at least in part on a potential supplied to an external pin (not shown) of the memory device 300. In these and other embodiments, the target voltage at block 484 of the routine 480 can be the same target voltage as the target voltage at block 482 of the routine 480 or another target voltage. Based at least in part on the comparison, the routine 480 generates a calibration potential $X_2$, which the routine 480 uses to adjust the resistance of the variable resistor 373 until the voltage $V_{DQ0}$ at the DQ pin $DQ_0$ is equivalent to the target voltage. At this point, the impedance of the termination circuit of the DQ pin $DQ_0$ of the memory device 300 matches the impedance of the output driver of the corresponding I/O pin $I/O_0$ of the host device 308 and the impedance of the data line 319.

Although the blocks 481-484 of the routine 480 are discussed and illustrated in a particular order, the routine 480 illustrated in FIG. 4 is not so limited. In other embodiments, the routine 480 can be performed in a different order. For example, blocks 483 and 484 can be performed before blocks 481 and 482. In these and other embodiments, any of the blocks 481-484 of the routine 480 can be performed before, during, and/or after any of the other blocks 481-484 of the routine 480. Moreover, a person of ordinary skill in the relevant art will recognize that the illustrated routine 480 can be altered and still remain within these and other embodiments of the present technology. For example, one or more blocks 481-484 of the routine 480 illustrated in FIG. 4 can be omitted and/or repeated in some embodiments.

For the sake of clarity and understanding, the routine 480 is described at least in part above with reference to a single DQ pin of a memory device. Persons of ordinary skill in the art will readily appreciate that the routine 480 can be used to calibrate the impedances of multiple (e.g., all or a subset of the) DQ pins of the memory device. Furthermore, persons of ordinary skill in the art will readily appreciate that the routine 480 can be used to calibrate the impedances of a second DQ pin of the memory device before, during, and/or after the routine 480 is used to calibrate the impedances of a first DQ pin of the memory device. For example, the routine 480 can be used in some embodiments to calibrate the impedances of all or a group of DQ pins of a memory device sequentially or in parallel.

In some embodiments, a memory device configured in accordance with various embodiments of the present technology can perform all or a subset of one or more of the blocks 481-484 of the routine 480 when the memory device and/or a memory system incorporating the memory device are powered on and/or are placed in a reset condition. Additionally, or alternatively, the memory device can perform (e.g., periodically) all or a subset of one or more of the blocks 481-484 of the routine 480 during normal operation of the memory device. For example, the memory device and/or a memory system incorporating the memory device can track temperature and/or voltage during operation of the memory device and/or the memory system. As the temperature and/or voltage change (e.g., by a threshold amount), the memory device can perform all or a subset of one or more of the blocks 481-484 of the routine 480 to match the impedances of the data output drivers and/or termination circuits of all or a subset of the DQ pins of the memory device to the impedances of corresponding termination circuits and/or data output drivers, respectively, of a memory controller or other host device connected to the memory device (as well as the impedance of the data lines connecting the memory device to the memory controller and/or the host device). In these and still other embodiments in which the memory device additionally includes ZQ calibration circuitry, the memory device can perform ZQ calibration using the ZQ calibration circuitry before, during, and/or after performing the routine 480 using corresponding DQ calibration circuitry.

Figure 5:
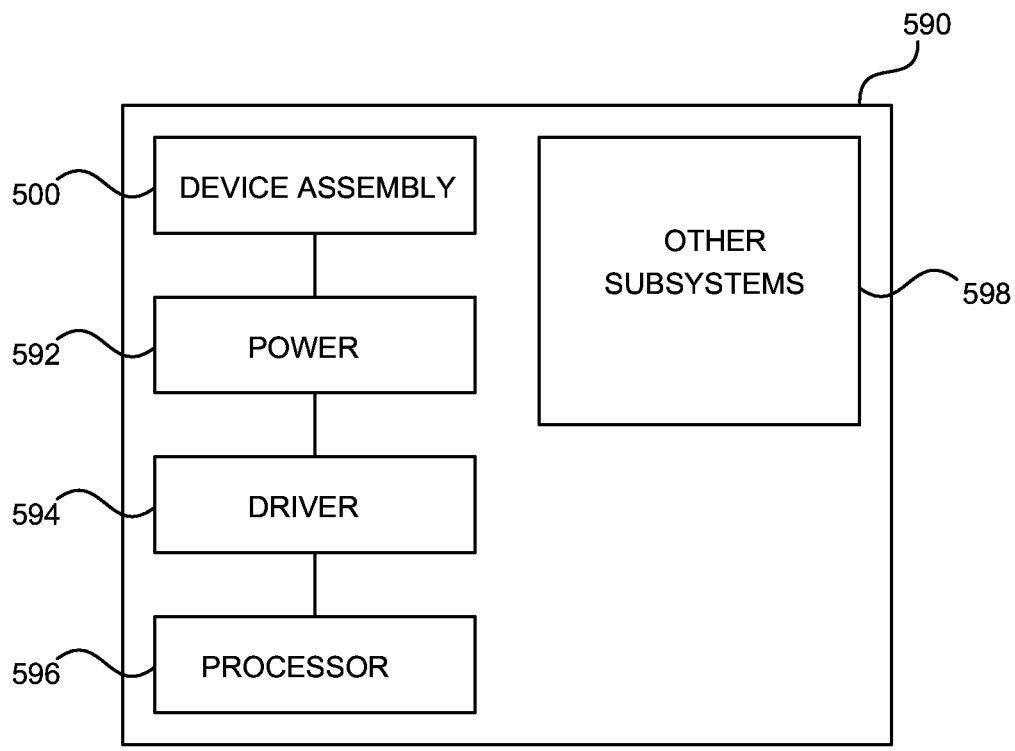
FIG. 5 is a schematic view of a system that includes a memory device configured in accordance with various embodiments of the present technology.

FIG. 5 is a schematic view of a system that includes a memory device in accordance with embodiments of the present technology. Any one of the foregoing memory devices described above with reference to FIGS. 1-4 can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the memory device described above with reference to FIGS. 1-4, and can, therefore, include various features of DQ calibration. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A device apparatus, comprising:
a memory array,
a plurality of DQ pins operably connected to the memory array; and
circuitry dedicated to an individual DQ pin of the plurality of DQ pins and configured to:
  generate, at least in part, a voltage at the DQ pin based, at least in part, on an impedance internal to a host device electrically connected to the device apparatus via the DQ pin, and
  based, at least in part, on the voltage at the DQ pin, adjust an impedance associated with the DQ pin to match an impedance associated with an input/output (I/O) pin of the host device that corresponds to the DQ pin.

2. The device apparatus of claim 1, wherein the circuitry includes an output driver and/or a termination circuit corresponding to the DQ pin, and wherein the impedance associated with the DQ pin is an impedance of the output driver and/or an impedance of the termination circuit.

3. The device apparatus of claim 2, wherein the circuitry further includes at least one variable resistor and at least one comparator corresponding to the output driver and/or to the termination circuit of the DQ pin.

4. The device apparatus of claim 1, wherein the circuitry is further configured to:
compare the voltage generated at the DQ pin to a target voltage; and
based, at least in part, on the comparison, adjust a variable resistance of an output driver and/or a termination circuit of the device apparatus that correspond to the DQ pin.

5. The device apparatus of claim 4, further comprising an external pin configured to receive the target voltage.

6. The device apparatus of claim 1, wherein:
the plurality of DQ pins includes every DQ pin of the memory device;
the circuitry is a first DQ calibration circuit dedicated to a first DQ pin of the plurality of DQ pins;
the memory device includes a plurality of DQ calibration circuits; and
each DQ pin of the plurality of DQ pins is electrically connected to a dedicated DQ calibration circuit of the plurality of DQ calibration circuits.

7. The device apparatus of claim 1, wherein:
the voltage at the DQ pin is a first voltage at the first DQ pin;
the impedance internal to the host device is a first impedance;
the I/O pin is a first I/O pin of the host device;
the circuitry is first circuitry dedicated to a first DQ pin;
the device apparatus further includes second circuitry different than the first circuitry and dedicated to a second individual DQ pin of the plurality of DQ pins; and
the second circuitry is configured to:
  generate, at least in part, a second voltage at the second DQ pin, wherein the second voltage at the second DQ pin is based, at least in part, on a second impedance internal to the host device different than the first impedance, and
  based, at least in part, on the second voltage at the second DQ pin, adjust an impedance associated with the second DQ pin to match a corresponding impedance associated with an input/output (I/O) pin of the host device corresponding to the second DQ pin.

8. A method, comprising:
generating, at least in part, a voltage at a DQ pin of a memory device using circuitry dedicated to only the DQ pin, wherein the voltage is based, at least in part, on an impedance internal to a host device electrically connected to the memory device via the DQ pin;
comparing the voltage to a target voltage; and
based at least in part on the comparison, adjusting an impedance associated with the DQ pin to match an impedance associated with an input/output (I/O) pin of the host device that corresponds to the DQ pin.

9. The method of claim 8, wherein:
generating the voltage at the DQ pin includes driving an output driver of the memory device high while a termination circuit of the host device is driven low;
the output driver corresponds to the DQ pin and the termination circuit corresponds to the I/O pin.

10. The method of claim 9, wherein:
the impedance associated with the DQ pin is an impedance of the output driver; and
adjusting the impedance of the output driver includes adjusting a resistance associated with the output driver based, at least in part, on the comparison.

11. The method of claim 8, wherein:
generating the voltage at the DQ pin includes driving a termination circuit of the memory device low while an output driver of the host device is driven high;
the termination circuit corresponds to the DQ pin and the output driver corresponds to the I/O pin.

12. The method of claim 11, wherein:
the impedance associated with the DQ pin is an impedance of the termination circuit; and
adjusting the impedance includes adjusting a resistance associated with the termination circuit based, at least in part, on the comparison.

13. The method of claim 8, further comprising receiving the target voltage at an external pin of the memory device.

14. The method of claim 8, wherein the generating, the comparing, and the adjusting are performed upon powerup of the memory device and/or when the memory device is placed in a reset condition.

15. The method of claim 8, wherein:
the method further comprises tracking voltage and/or temperature at the DQ pin; and
the generating, the comparing, and the adjusting are performed each time the voltage and/or the temperature change by a threshold amount.

16. The method of claim 8, wherein:
the DQ pin is a first DQ pin, the circuitry is first circuitry, the generated voltage is a first voltage, the impedance internal to the host device is a first impedance, the impedance associated with the DQ pin is an impedance associated with the first DQ pin, the I/O pin is a first I/O pin, and the impedance associated with the I/O pin is an impedance associated with the first I/O pin; and
the method further comprises—
generating, at least in part, a second voltage at a second DQ pin of the memory device using second circuitry dedicated to only the second DQ pin, wherein the second DQ pin is different from the first DQ pin, and wherein the second voltage is based, at least in part, on a second impedance internal to the host device different than the first impedance;
comparing the second voltage to the target voltage; and
based at least in part on the comparison, adjusting an impedance associated with the second DQ pin to match an impedance associated with a second input/output (I/O) pin of the host device that corresponds to the second DQ pin.

17. The method of claim 16, wherein generating the second voltage, comparing the second voltage, and adjusting the impedance associated with the second DQ pin are performed in parallel with generating the first voltage, comparing the first voltage, and adjusting the impedance associated with the first DQ pin, respectively.

18. A memory system, comprising:
a host device including—
an input/output (I/O) pin,
an output driver corresponding to the I/O pin, and
a termination circuit corresponding to the I/O pin; and
a device apparatus electrically connected to the host device via a data line, wherein the memory device includes—
a memory array,
a DQ pin operably connected to the memory array and corresponding to the I/O pin of the host device,
a termination circuit corresponding to the DQ pin,
an output driver corresponding to the DQ pin, and
circuitry dedicated to only the DQ pin, wherein the circuitry is configured to:
generate, at least in part, a voltage at the DQ pin based, at least in part, on an impedance of the output driver and/or the termination circuit of the host device; and
based, at least in part, on the voltage, adjust (i) an impedance of the termination circuit and/or the output driver of the memory device to match (ii) the impedance of the output driver and/or the termination circuit of the host device, and an impedance of the data line.

19. The memory system of claim 18, wherein:
the memory system is configured to drive the output driver of the host device high while driving the termination circuit of the memory device low to generate the voltage at the DQ pin; and
the circuitry is configured to adjust (i) the impedance of the termination circuit of the memory device to match (ii) the impedance of the output driver of the host device and the impedance of the data line.

20. The memory system of claim 19, wherein:
the memory system is configured to drive the termination circuit of the host device low while driving the output driver of the memory device high to generate the voltage at the DQ pin; and
the circuitry is configured to adjust (i) the impedance of the output driver of the memory device to match (ii) the impedance of the termination circuit of the host device and the impedance of the data line.

* * * * *